United States Patent [19]
Shirai et al.

[11] Patent Number: 5,493,222
[45] Date of Patent: Feb. 20, 1996

[54] REFLECTION TYPE MAGNETOOPTIC SENSOR HEAD WITH FARADAY ROTATOR

[75] Inventors: Kazushi Shirai; Toshihiro Shinbo; Norio Takeda; Mitsuzo Arii, all of Tokyo, Japan

[73] Assignee: Mitsubishi Gas Chemical Company, Ltd., Tokyo, Japan

[21] Appl. No.: 56,881

[22] Filed: May 5, 1993

[30] Foreign Application Priority Data

May 8, 1992 [JP] Japan .................................. 4-116141
May 22, 1992 [JP] Japan .................................. 4-130674

[51] Int. Cl.$^6$ .............................................. G01R 33/032
[52] U.S. Cl. ................................. 324/244.1; 359/280
[58] Field of Search ........................... 324/244.1, 260; 359/280, 281, 282, 283

[56] References Cited

FOREIGN PATENT DOCUMENTS

| 0046298 | 2/1982 | European Pat. Off. . |
| 9015613 | 3/1991 | Germany . |
| 3287088 | 12/1991 | Japan . |

OTHER PUBLICATIONS

Magneto–Optical Garnet Materials in Fibre Optic Sensor Systems for Magnetic Field Sensing Kjell Svantesson—pp. 260–269, SPIE vol. 1274, Electro–Optic and Magneto–Optic Materials II (1990).
Soviet Inventions Illustrated—Section EI, Week 8422, Jul. 1, 1984; Derwent Publications Ltd., London & SU–A–1 038 894, Aug. 1983.

Primary Examiner—Walter E. Snow
Attorney, Agent, or Firm—Sughrue, Mion, Zinn, Macpeak & Seas

[57] ABSTRACT

A reflection type magnetooptic sensor head. The respective structural elements are aligned in the order of a light source, light inputting/outputting path, polarizer, Faraday rotator, and reflecting film. The Faraday rotator is made of a (111) bismuth-substituted iron garnet single crystal film. The Faraday rotator is positioned such that the optical axis of the light incident upon the surface of the Faraday rotator makes an angle of 10 to 70 degrees with an axis normal to the surface of the Faraday rotator. The sensor head may further include two identical rectangular prisms positioned such that the Faraday rotator is sandwiched between the slanting surfaces of the prisms.

3 Claims, 6 Drawing Sheets

REFLECTION TYPE MAGNETOOPTIC SENSOR HEAD WITH FARADAY ROTATOR

BACKGROUND OF THE INVENTION

1. Field of the Invention

The present invention relates to a magnetooptic sensor head that uses the Faraday effect of a bismuth-substituted iron garnet, and more particularly to the construction of a magnetooptic sensor head which senses the intensity of a magnetic field and is inexpensive, small in size, light weight, and suitable for mass production.

2. Prior Art

Today, many conventional industrial apparatuses and consumer equipment include rotating devices or rotating mechanism such as motors and gears. The advances in science and technology have enabled industry to accurately control apparatuses for industrial use such as aircraft and ships and consumer apparatuses such as automotive vehicles in order to address the problems such as conservation of global environment and energy saving. In order to implement higher level and more accurate control of rotating apparatuses, the rotational speeds thereof must be measured both continuously and accurately. This measurement requires accurate measuring devices which are simple, light weight, and readily available at low costs and in large quantity. The measurement of rotational speeds includes a variety of methods. For example, a rotational speed meter as shown in FIG. 1, which makes use of electromagnetic induction, has been developed and used for measuring the rotational speeds of engines for aircraft and automotive vehicles (Sensor Gijutsu, page 68, December, 1986). Another way of measuring rotational speeds has been proposed which makes use of a magnetooptic sensor head based on the Faraday effect of magnetooptic materials (Applied Optics, Vol.28, No.11, page 1,992, 1989).

The probe of a rotational speed meter for the engines of aircraft and automotive vehicles are based on electromagnetic induction. This type of rotational speed meter is susceptible to electromagnetic noise that comes in through the cables connecting the probe and the main body of the meter. Furthermore, since electric circuits are involved, this type of rotational speed meter must be designed so that the electric circuits will not cause explosion when used in an environment where flammable materials such as organic solvents are used or stored.

A magnetooptic sensor head based on the Faraday effect of a magnetooptic material makes use of a the rotation of polarization plane of the material in response to the presence and absence of a magnetic field (or magnet) when a permanent magnet (or magnetic field) approaches the magnetooptic material. That is, the rotation of the polarization plane of light that is transmitted through a magnetooptic material incorporated in a magnetooptic sensor head, is converted into changes in light intensity, and the number of changes is counted to determine the rotational speed (National Technical Report, Vol.29, No.5, p70, (1983)).

FIG. 1 shows general construction of a transmission type magnetooptic sensor head. In FIG. 1, light emitted from light source 1 such as a semiconductor laser, enters a polarizer 2 in the form of, for example, calcite. The light exists the polarizer 2 as a linearly polarized light where the polarization plane is in one direction, and enters a Faraday rotator 3 which is usually made of a magnetooptic material such as zinc selenide (ZnSe).

The polarization plane of the light exiting the Faraday rotator 3 has been rotated through an angle $\Theta_F$ in accordance with an applied external magnetic field Hex. The light exiting the Faraday rotator 3 then enters an analyzer 4 made of, for example, calcite.

The intensity P of the light from the analyzer 4 is given by $$P = k \cos^2(\phi - \Theta_F) \quad (1)$$

where $\phi$ is an angle of the polarizer 2 relative to the analyzer 4, $\Theta_F$ is an angle through which the polarization plane rotates, and k is a proportional constant. Assuming that $\phi$ is equal to 45 degrees, Equation (1) can be rewritten as follows:

$$P = k(1 + \sin 2\Theta_F)/2 \quad (2)$$

Further, if $\Theta_F$ is sufficiently small, Equation (2) can be approximated as follows:

$$P = k(1 + 2\Theta_F)/2 \quad (3)$$

Equation (3) indicates that the intensity of light becomes proportional to $\Theta_F$ if $\phi$ is selected to be 45 degrees. In other words, the rotational angle $\Theta_F$ of the polarization due to applied external magnetic field Hex can be detected or measured in terms of the intensity of light by the use of the analyzer 4.

Various proposals have been made for the systems and configurations of a magnetic field sensor head. They can be grouped into transmission type and reflection type. With the type of sensor head shown in FIG. 1, because of the nature of the structural elements, the elements must be aligned in a straight line so that the light travels straight. Thus, if obstructions are located in the light path, the magnetooptic sensor head cannot be placed properly.

Japanese Patent Preliminary Publication No.56-55811 discloses a reflection type magnetooptic sensor head which overcomes the deficiencies of the transmission type. FIG. 2 shows the general construction of a reflection type magnetooptic sensor head. In FIG. 2, a signal light passes through an optical fiber 5a and then through a lens 6a to a polarizer 7 made of, for example, rutile single crystal. The light from the polarizer 7 enters a Faraday rotator 8 to a rectangular prism 9 which reflects the light back to the Faraday rotator 8. The light from the Faraday rotator 8 is then incident upon the analyzer 10 and is then coupled via a lens 6b to an optical fiber 5b.

The construction of the reflection type in FIG. 2 differs from the transmission type in that the rectangular prism 9 is provided to reflect the signal light. With a reflection type magnetooptic sensor head shown in FIG. 2, the input optical cable is aligned in parallel with the output optical cable. In other words, the Faraday rotator 8 is disposed at the tip end portion of the sensor head. Thus, a reflection type magnetooptic sensor head is advantageous in that the sensor head can be installed in a narrow space where a transmission type magnetooptic sensor head cannot be installed. However, the reflection type sensor head of Matsui et al. is disadvantageous in that the lens 6a must be in series with the polarizer 7, the lens 6b must be in series with the analyzer 10, and these two series connections must be in parallel with each other. This requirement of aligning the elements places limitations on the automatic assembly operation of the entire system, and is not cost effective.

FIG. 3A relates to Japanese Patent Publication No.3-22595 (Natsumura et al.) which proposes a configuration where the polarizer 7 and the analyzer 10 are replaced by a single polarizer. This configuration overcomes the deficiency of the reflection type magnetooptic sensor head proposed by Matsui et el.

In FIG. 3A, the light emitted from a light source 11 such as a semiconductor laser, passes through a lens 12 and a half mirror 13. The light then enters an optical fiber 14. The half mirror 13 permits part of the light to pass through and reflects part of the light incident thereupon so that the reflected light enters a light path 1. A photodetector or power meter 18 placed in the light path 1 and serves to measure variations in the intensity of light emitted from the light source 11. The signal light directed to the optical fiber 14 passes through a polarizer 15 made of, for example, futile single crystal, and a Faraday rotator 16 made of magnetooptic material to a reflecting film 17. The reflecting film 17 is usually made of a metallic thin film.

The light that reached the reflecting film 17 is then reflected back to the Faraday rotator 18 and then to the polarizer 15. The returning light through the polarizer 15 enters the optical fiber 14. The returning light exiting the optical fiber 14 enters the half mirror 13 which reflects in part the light into a light path 2. The light passing through the light path 2 then enters the photodetector 19 which measures the intensity of the light.

Matsumura et al. employed yttrium iron garnet ($Y_3Fe_5O_{12}$), usually referred to as YIG, as a Faraday rotator produced by a flux melt technique. YIG is advantageous as a Faraday rotator element in that the Faraday rotation coefficient (deg/cm) is larger in YIG than in paramagnetic glass and zinc selenide. The use of YIG proposed by Natsumura et al. is one way of overcoming the deficiency of a reflection type magnetooptic sensor head proposed by Natsui et al.

In fact, the use of YIG is attractive in terms of ease of production. However, YIG may not be practical as a Faraday rotator since it is well known that YIG transmits light in the near infrared range having wavelengths longer than 1.1 $\mu$m and absorbs light in the 0.8 $\mu$m band.

Conventionally, an optical sensor head uses a light source such as a semiconductor laser (LD) or light emitting diodes (LED) having median wavelengths in the range of 0.78–0.85 $\mu$m. Semiconductor laser and light emitting diodes are used as a light source for a photosensor because they are very inexpensive in the above wavelength range, and because photodetectors have good sensitivity in that range. Thus, using light sources available on the market is most preferred and is the best way to provide inexpensive magnetooptic sensor heads that meet the user's needs.

High light absorption of YIG implies that the detection of light may be difficult if a conventional light source is used. That is, YIG is inherently deficient as a Faraday rotator.

The inventors of the present invention investigated many other materials in order to overcome the deficiency of YIG. The inventors concluded that bismuth-substituted iron garnets can be used as a magnetooptic material. The bismuth-substituted iron garnets can be manufactured rather easily by the LPE (Liquid Phase Epitaxial) method, and lends itself to mass production. Bismuth-substituted iron garnets are represented by a chemical formula $(RBi)_3(FeA)_5O_{12}$, where R represents yttrium Y or rare earth elements and A represents aluminum Al and gallium Ga.

The Faraday rotation coefficient of a bismuth-substituted iron garnet, i.e., the rotation angle of the polarization plane per unit film thickness at the saturated magnetization is as large as several times as large that of YIG, about ten times as large at the 0.8 $\mu$m band. This indicates that the film thickness can be smaller with increasing Faraday rotation coefficient for the same magnetooptic effect, achieving less light absorption loss and smaller size. The film thickness of an element can be smaller in bismuth-substituted iron garnets than in YIG, indicating less light absorption. Thus, bismuth-substituted iron garnets are useful in implementing a magnetooptic sensor head with a light source having a wavelength in the 0.8 $\mu$m band.

The magnetic saturation of bismuth-substituted iron garnets ranges from 500 to 1200 Oe which are about half that of YIG (about 1800 Oe). This indicates that the bismuth-substituted iron garnets can be used to measure weak magnetic fields as well. The ability to measure weak magnetic fields implies that the distance between the permanent magnet and the magnetooptic sensor head can be longer. This provides more flexibility and higher degrees of freedom in installing the magnetooptic sensor head and suggests wider fields of application for magnetooptic sensor heads.

With the aforementioned investigation, the inventors of the present invention believed that reflection type magnetooptic sensor heads can be developed by the use of a bismuth-substituted iron garnet as a Faraday rotator. Based on the disclosure in Japanese Patent Publication No.3-22595, the inventors of the present invention built an engineering model of a reflection type magnetooptic sensor head as shown in FIG. 3B using a Faraday rotator made of a bismuth-substituted iron garnet single crystal in place of YIG.

In FIG. 3B, the light emitted from a light source 51 such as a semiconductor laser, passes through a lens 52 which condenses the light, and then through a half mirror 53 which reflects the light in part and transmits the rest of the light. The light then enters an optical fiber 54. The light directed to the optical fiber 54 is converted by a lens 55 in the form of, for example, a gradient-index rod lens into a parallel light before entering the polarizer 56 which converts the light into a linearly polarized light. The linearly polarized light enters a Faraday rotator 57 made of a (111) bismuth-substituted iron garnet and part of the light is transmitted through the Faraday rotator 57 to a reflecting film 58 made of, for example, a metallic thin film. The light impinging on the reflecting film 58 is then reflected back and enters the Faraday rotator 57 and then the polarizer 56. The light exiting the polarizer 56 is then coupled to the optical fiber 54 via the lens 55. The light passes through the optical fiber 54 into the half mirror 55 which reflects the light in part to a photodetector 59 or power meter which determines the light intensity.

Using the thus built reflection type magnetooptic sensor head, the inventors made a variety of experiments for various magnetic field intensities. However, the sensor head failed to detect any light signals regardless of whether a magnetic field was applied.

Therefore, the inventors made various experiments in order find out why the reflection type magnetooptic sensor head according to FIG. 3B failed to detect the light signals. Having made many experiments, the inventors finally realized that the sensor head failed to detect light due to the magnetic domain structure of the Faraday rotator. The inventors realized that a reflection type magnetooptic sensor head of the construction in FIG. 3B cannot detect light signals if the Faraday rotator is made of a multidomain element such as bismuth-substituted iron garnets, which have a number of magnetic domains.

The result obtained by the inventors of the present invention do not agree with the experimental results obtained by Matsumura et al. who used YIG as a Faraday rotator which also has multidomain structure as in a bismuth-substituted iron garnet. The inventors wondered why a bismuth-substituted iron garnet with multidomain did not properly function as a Faraday rotator in the reflection type magnetooptic sensor head built according to the construction in FIG. 3B similar to the YIG in Japanese Patent Publication No. 5-22595, while a YIG having the same multidomain functioned properly as a Faraday rotator in Japanese Patent Publication No. 3-22595.

Having reviewed the aforementioned experimental results and making further basic experiments, the inventors confirmed that a reflection type magnetooptic sensor head can be constructed of a reflecting film, (111) bismuth-substituted iron garnet single crystal, polarizer, and light-inputting/outputting paths. Further, the light-inputting/outputting paths are divided into two light paths; an incoming-light path for the light coming into the polarizer from a light source and an outgoing light path for the light leaving the polarizer back to the light source. The two light paths are aligned such that they make an angle greater than five degrees with respect to each other. The inventors further continued the research work of magnetooptic sensor heads and developed a reflection type magnetooptic sensor head using a Faraday rotator made of a bismuth-substituted iron garnet as disclosed in Japanese Patent Application No.4-90976.

FIG. 4 shows the construction of a reflection type magnetooptic sensor head disclosed in Japanese Patent Application No. 4-90976. In FIG. 4, a polarizer 20 is in the form of, for example, POLARCORE (Trade name) sold by CORNING and a Faraday rotator 21 is made of a (111) bismuth-substituted iron garnet single crystal film which is magnetized most easily in a direction normal to the film surface. The Faraday rotator 21 is exposed to a magnetic field to be measured. A reflecting film 22 is in the form of, for example, the multilayer of a dielectric material. An optical waveguide 25 for incoming light is formed on glass or polymer, or is in the form of an optical fiber optical waveguide 24 for outgoing lights is formed on glass or polymer, or is in the form of an optical fiber. The light emitted from a light source 26 such as semiconductor laser, is directed through a lens 25 into the incoming light path 25. The light exiting the light path 25 then passes through the polarizer 20, the Faraday rotator 21 to the reflecting film 22. The light is then reflected by the reflecting film 22 back through the Faraday rotator 21, the polarizer 20, the light path 24 to a photodetector 27 which detects the light as a light signal. With the reflection type magnetooptic sensor head in FIG. 4, the light inputting/outputting port has two independent paths 23 and 24 which make an angle $\alpha$ greater than five degrees relative to each other.

The aforementioned reflection type magnetooptic sensor head using a Faraday rotator made of a bismuth-substituted iron garnet, meets the requirements for a magnetooptic sensor head. However, as shown in FIG. 4, the two light paths must be aligned such that they make an angle $\alpha$ greater than five degrees with respect to each other. This construction is disadvantageous in implementing a sensor probe having a diameter less than five millimeters. Thus, the sensor is no use for measuring a magnetic field in a very narrow space such as a cylinder provided in the rotating shafts of gyros or turbines where the diameters are on the order of several millimeters. Further, the sensor of FIG. 4 has the disadvantage that the cost of optical fibers may become a problem if the distance between the probe (magnetooptic sensor head) and the photodetector (magnetic field measuring device) is long.

SUMMARY OF THE INVENTION

A reflection type magnetooptic sensor head is provided in which the respective structural elements are aligned in the order of a light source, light inputting/outputting path, polarizer, Faraday rotator, and reflecting film. The Faraday rotator is made of a (111) bismuth-substituted iron garnet single crystal film. The Faraday rotator is positioned such that an optical axis of the light incident upon the surface of the Faraday rotator makes an angle of 10 to 70 degrees with an axis normal to the surface of the Faraday rotator. The sensor head may further include two identical rectangular prisms positioned such that the Faraday rotator is sandwiched between the slanting surfaces of the prisms. The sensor head further includes a first rectangular prism and a second rectangular prism, the first and second prisms being identical with each other. Each of the prisms has a first surface, a second surface orthogonal to the first surface, and a slanting surface. The first and second rectangular prisms are positioned such that the Faraday rotator is sandwiched between the two slanting surfaces, and the first surfaces of the two rectangular prisms are parallel to each other and the second surfaces of the first and second rectangular prisms are parallel to each other.

BRIEF DESCRIPTION OF THE DRAWINGS

Features and other objects of the invention will become more apparent from the description of the preferred embodiments with reference to the accompanying drawings in which.

DETAILED DESCRIPTION OF THE PREFERRED EMBODIMENTS

The inventors continued research work in order to develop a general purpose, miniaturized, and high performance reflection type magnetooptic sensor head. This reflection type magnetooptic sensor head can be easily manufactured by the liquid phase epitaxial (LPE) method and solves the deficiencies of a Faraday rotator made of a bismuth-substituted iron garnet which has good optical properties. The inventors concluded that even if a single light path is used instead of independent incoming-light path and outgoing-light path, light signals can still be detected by positioning the Faraday rotator made of a bismuth-substituted iron garnet such that the Faraday rotator makes an angle with respect to the surfaces of the polarizer and reflecting film.

The reflection type magnetooptic sensor head based on a bismuth-substituted iron garnet according to the present invention is constructed of a light inputting/outputting path, polarizer, bismuth-substituted iron garnet single crystal film (Faraday rotator), and reflecting film. Here, a bismuth-substituted iron garnet single crystal film means a (111) bismuth-substituted iron garnet single crystal film.

Figure 5:
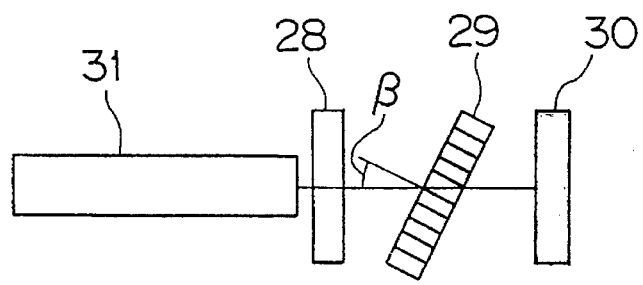
FIG. 5 shows an essential part of a second embodiment of a magnetooptic sensor head according to the present invention.

FIG. 5 shows a reflection type magnetooptic sensor head according to the present invention, the respective structural elements are aligned in the order of a light source, light inputting/outputting paths, polarizer, bismuth-substituted iron garnet single crystal film (Faraday rotator), and reflecting film. The bismuth-substituted iron garnet single crystal film is positioned so that the optical axis of the light incident upon the film makes an angle β of 10 to 70 degrees with an axis normal to the film surface, i.e., the magnetization direction of the bismuth-substituted iron garnet crystal film makes an angle β of 10 to 70 degrees with the traveling direction of the light.

In FIG. 5, a polarizer 28 is made of, for example, POLARCORE. A Faraday rotator 29 is made of a (111) bismuth-substituted iron garnet single crystal film and is positioned such that the axis normal to the film surface is at an angle of β with the optical axis of the light path. A reflecting film 30 is made of a metallic film. A light inputting/outputting path 31 is in the form of, for example, an optical fiber or an optical waveguide. For miniaturization of a reflection type magnetooptic sensor head, the light inputting/outputting path 31 may be arranged to branch or separate the light reflected by the reflecting film 30 in order to direct part of the reflected light into the photodetector.

Figure 6:
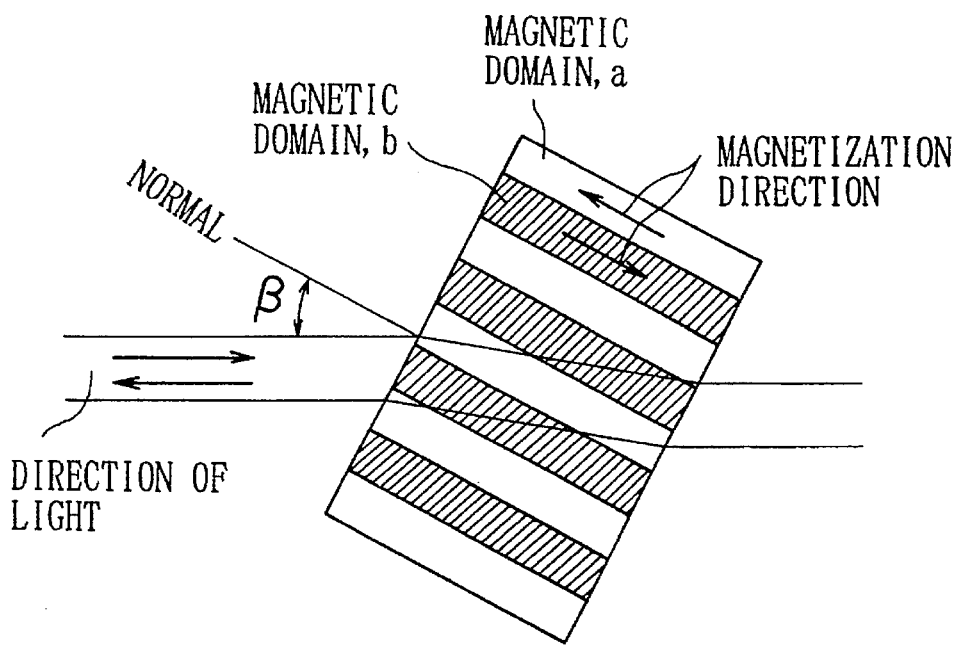
FIG. 6 shows the positional relation between the light path and magnetic domains when a Faraday rotator made of a (111) bismuth-substituted iron garnet film is at an angle with the light path.

As mentioned above, with a reflection type magnetooptic sensor head based on a Faraday rotator made of a bismuth-substituted iron garnet single crystal film having multidomains, the light must travel through different magnetic domains, i.e., magnetic domains a and magnetic domains b during its travel from the light inputting/outputting path 31 through the bismuth-substituted iron garnet single crystal film 29 to the reflecting film 30 and back to the light inputting/outputting path 31 through the bismuth-substituted iron garnet single crystal film 29. FIG. 6 shows that the Faraday rotator 29 is tilted so that the light travels in a direction which makes an angle β with the axis normal to the surface of the Faraday rotator 29. This arrangement allows the light returning from the reflecting film 30 to travel through magnetic domains different from the light traveling toward the reflecting film 30.

When detecting a magnetic field by the use of a magnetooptic sensor head, measurement accuracy is affected by the fluctuation of intensity of the light source as well as light reflected by surfaces other than the reflecting film. Such surfaces include the surfaces of the polarizer and the bismuth-substituted iron garnet single crystal. Thus, accurate measurement requires the difference A P in intensity of the light signals when the sensor head is not applied with a magnetic field and when the bismuth-substituted iron garnet is substantially magnetically saturated (Japanese Patent Aplication No. 4-90976).

In the present invention, the difference ΔP in intensity becomes greater than 2 dB when the optical axis of the light incident upon the (111) bismuth-substituted iron garnet single crystal film makes an angle β greater than 10 degrees with the axis normal to the surface of the film. The difference ΔP becomes greater with increasing angle β. However, too large an angle β causes the total reflection of the incident light ray by the surface of the (111) bismuth-substituted iron garnet, or results in a longer effective distance between the light inputting/outputting path and the reflecting film. This longer distance in turn causes lower intensity of the light reflected back by the reflecting film. Therefore, the angle β should be in the range of 10 to 70 degrees, and more preferably in the range of 20–45 degrees.

Although the polarizer can be any one of conventional ones, a dichroic polarizer is preferred for its small thickness and high extinction ratio.

When manufacturing a magnetic sensor head according to the present invention, there is no particular restriction on the compound of a bismuth-substituted iron garnet. However, it is preferable to select from iron garnet single crystals given by a general equation:

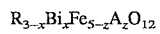

$$R_{3-x}Bi_xFe_{5-z}A_zO_{12}$$

where R is at least one of Y, La, Ce, Pt, Nd, Sm, Eu, Gd, Tb, Dy, Ho, Er, Tm, Yb, and Lu, A is at least one of Ga, Sc, Al, and In, and $0.3 \leq X < 2.0$ and $0 \leq Z \leq 1.0$.

Although a bismuth-substituted iron garnet single crystal can be manufactured by any well know process, the LPE process (Thin Solid Films, Vol.114, P33, (1984)) is preferred since the process provides simple operations and lends itself to mass production of the crystal. In the LPE process, any known substrate can be used and is usually selected from non-magnetic garnets $[(GdCa)_3(GaMgZr)_5O_{12}]$ having a lattice constant in the range from 12.490 to 12.515 angstroms referred to as SGGG substrate on the market.

The non-magnetic substrate on which a bismuth-substituted iron garnet thin film is formed, need not be removed. The non-magnetic substrate may be preferably left as a support to enhance mechanical strength if the thin film of a bismuth-substituted iron garnet single crystal film is as thin as several tens of microns.

First Embodiment

A first embodiment of the invention will now be described in detail with reference to FIG. 8.

Example 1-1

Figure 8:
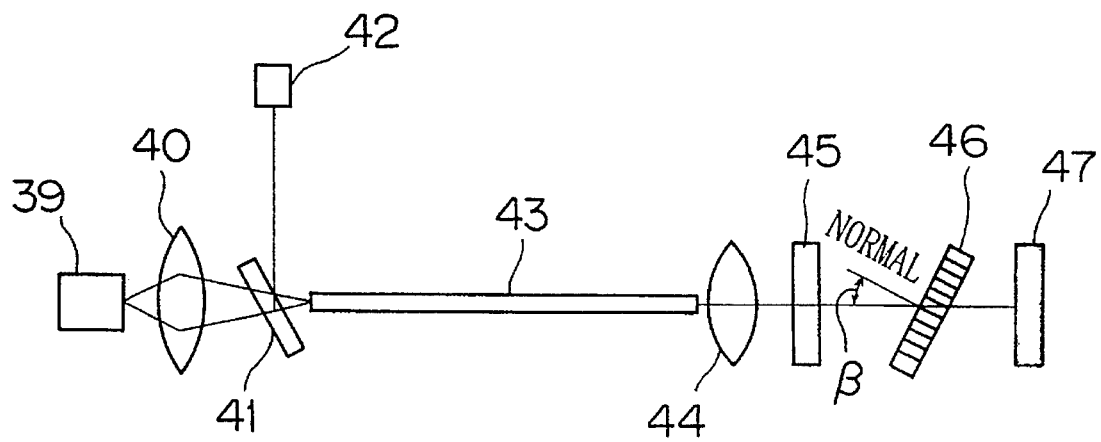
FIG. 8 shows a general construction of a first embodiment of a magnetooptic sensor head according to the present invention.

FIG. 8 shows a general construction of a first embodiment. In FIG. 8, the light of a wavelength of 0.786 μm, emitted by a semiconductor laser 39, travels through a lens 40, a half mirror 41, and optical fiber 43 having a wavelength of 400 μm, a lens 44, a glass polarizer (trade name is POLARCORE) sold by CORNING. A Faraday rotator 48 is positioned such that the optical axis of incident light makes an angle β of 10 degrees with the axis normal to the surface of the Faraday rotator 48. A reflecting film 47 is in the form of glass on which metallic aluminum film is deposited.

The Faraday rotator 48 was manufactured in the following manner. A 500 milliliter platinum crucible was placed on an LPE furnace, which platinum crucible contained therein a lead oxide (PbO, 4N) of 843 grams, a bismuth oxide ($Bi_2O_3$, 4N), of 978 grams, a ferric oxide ($Fe_2O_3$, 4N) of 128 grams, a boron oxide ($B_2O_3$, 5N) of 38 grams, a terbium oxide ($Tb_4O_7$, 3N) of 4.0 grams, and a holmium oxide ($Ho_2O_3$, 3N) of 9.0 grams. The content of the crucible was heated to a temperature of 1000 degrees so that the content melted. The melted content was then sufficiently beaten to produce a homogeneous mixture and was then cooled down to a melt temperature of 770 degrees to produce a melt for growing a bismuth-substituted iron garnet single crystal.

Then, using a known procedure, a two-inch (111) substrate of a garnet single crystal $(GdCa)_3(GaMgZr)_5O_{12}$ having a thickness of 480 μm and a lattice constant of 12.497±0.002 angstroms, was placed on the surface of the thus produced melt for 2.0 hours for epitaxial growth while maintaining the melt temperature at 770 degrees. A crystal obtained was a (111) bismuth-substituted iron garnet single crystal film having a compound of $Ho_{1.1}Tb_{0.6}Bi_{1.3}Fe_5O_{12}$ [(HoTbBiIG) single crystal] and having a film thickness of 46 μm. This crystal showed a Faraday rotation $\Theta_F$ of 42.5 degrees at a wavelength 786 nm with magnetization saturated.

An antireflection film was applied to the two opposed longitudinal ends of the optical fiber 43, lens 44, polarizer 45, and Faraday rotator 46. The difference in intensity of light was measured as follows: The signal light emitted from the light source 39 was coupled to the optical fiber 43 via the lens 40 and mirror 41. Then, the light was exposed to the sensor head constructed of the polarizer 45, Faraday rotator 46, and reflection film 47. Then, part of the light returned from the sensor head was reflected by the half mirror 41 to the photodetector 42 which determines the intensity of the returned light. The difference ΔP in intensity was 2.5 dB between when the sensor head is not applied with a magnetic field and when the sensor head is applied with a magnetic field of 1500 Oe, which is enough for the Faraday rotator 46 to be saturated.

EXAMPLE 1-2

The construction was the same as Example 1-1 except that the optical axis of the light path 43 is at an angle of 20 degrees with the axis normal to the surface of the Faraday rotator 46. The difference ΔP in intensity was 4.9 dB between when the sensor head is not applied with a magnetic field and when the sensor head is applied with a magnetic field of 1500 Oe, which is enough for Faraday rotator 46 to be saturated.

EXAMPLE 1-3

The construction was the same as Example 1-1 except that the optical axis of the light path is at an angle of 30 degrees with the axis normal to the surface of the Faraday rotator 46. The difference ΔP in intensity was 5.9 dB between when the sensor head is not applied with a magnetic field and when the sensor head is applied with a magnetic field of 1500 Oe, which is enough for the Faraday rotator to be saturated.

Comparison 1

The construction was the same as Example 1-1 except that the optical axis of the light path 46 is at an angle of 5 degrees with the axis normal to the surface of the Faraday rotator 46. The difference ΔP in intensity was 1.1 dB between when the sensor head is not applied with a magnetic field and when the sensor head is applied with a magnetic field of 1500 Oe, which is enough for the Faraday rotator 46 to be saturated.

Second Embodiment

A second embodiment of the invention will now be described in detail with reference to FIGS. 9 and 10.

Figure 9:
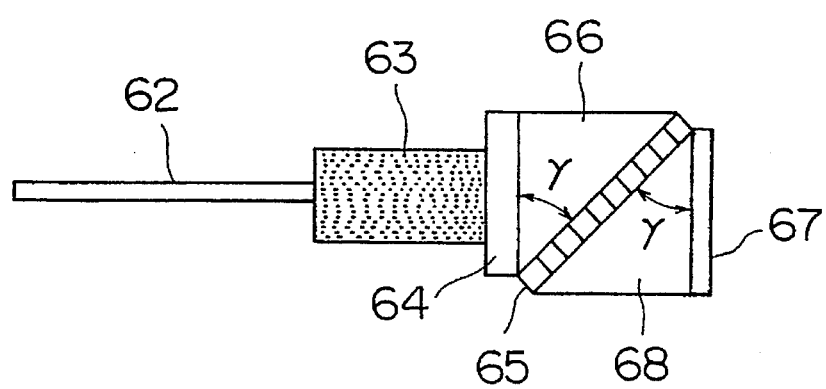
FIG. 9 shows an essential part of a second embodiment of a magnetooptic sensor head according to the present invention.
Figure 10:
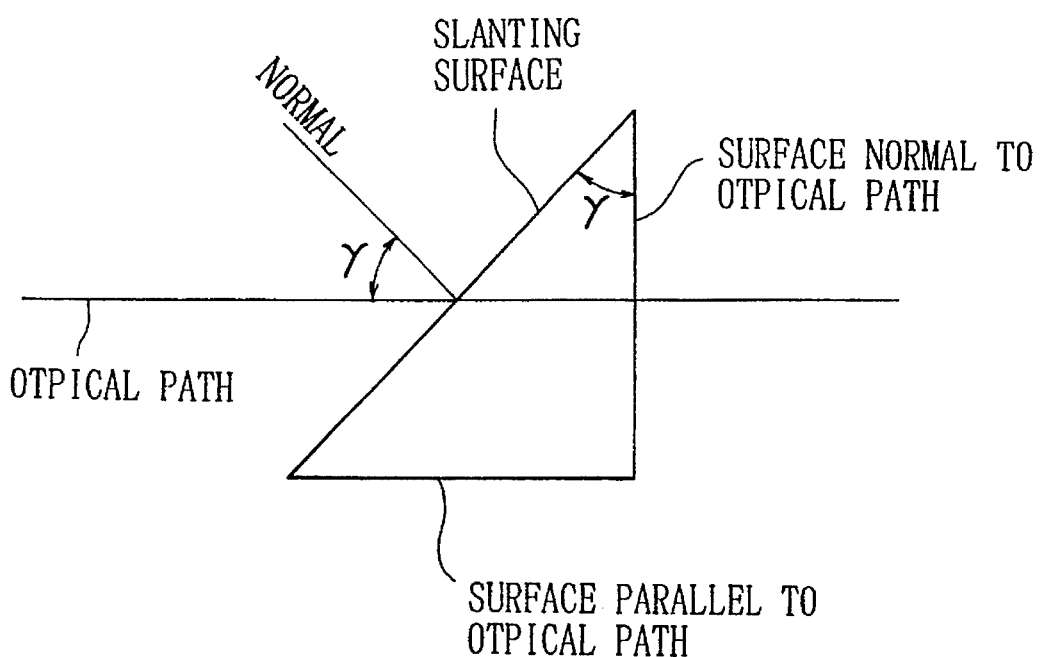
FIG. 10 shows geometric relation of a rectangular prism used in the second embodiment of FIG. 9.
Figure 11:
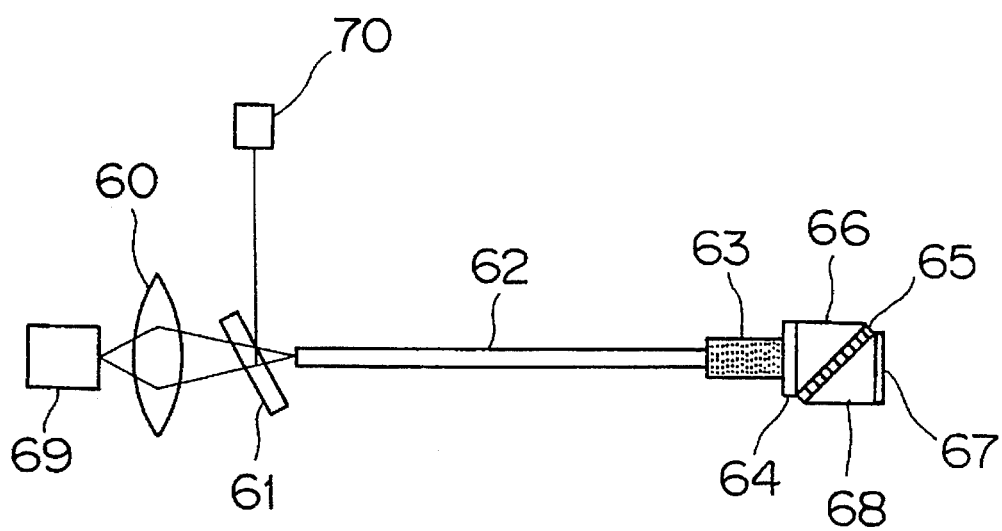
FIG. 11 shows a general construction of the second embodiment of a magnetooptic sensor head according to the present invention.

FIG. 9 shows the general construction of a magnetooptic sensor head of a second embodiment and FIG. 10 shows geometric relation of a rectangular prism used in the second embodiment of FIG. 9. FIG. 11 shows a general construction of a magnetooptic sensor head of the second embodiment.

In the reflection type magnetooptic sensor head of the first embodiment, a (111) bismuth-substituted iron garnet single crystal film must be positioned such that the axis normal to the surface of the film is at a predetermined angle β with the optical axis of the light beam incident upon the film. This requirement places some difficulty both in the assembly operation and in the alignment operation of the sensor head.

If the bismuth-substituted iron garnet is as thick as several hundred microns, the material will be strong enough that the non-magnetic substrate may be reduced in size by grinding.

There is no particular requirement for the reflection film, although it is preferred to use a mirror made of a metal film deposited on glass of a type commercially available, a bismuth-substituted iron garnet film, metallic mirror made by depositing gold or aluminum directly on a non-magnetic substrate, or a dielectric multilayer mirror made of multi-layer of metal oxides such as $SiO_2$ and $TiO_2$.

The light inputting/outputting paths do not have to be of a special type. They may be implemented with commercially available optical fibers or optical waveguides patterned in glass or polymer film, or air. Optical fibers are particularly preferred for mass production and small size. Any type of optical fiber may be used for the light paths, but those having core diameters less than 50 μm cause the width of the magnetic domain of a bismuth-substituted iron garnet to affect the characteristics of the sensor, resulting in unstable sensitivity and lower optical coupling efficiency.

Figure 1:
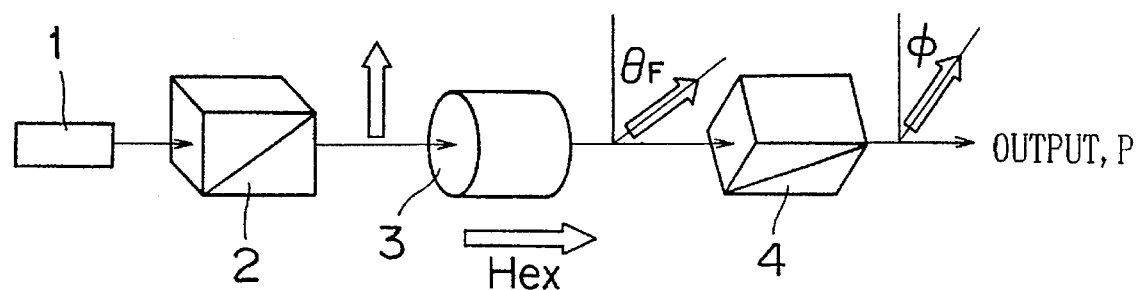
FIG. 1 shows diagrammatically the principle of a magnetooptic sensor head based on a Faraday effect.
Figure 2:
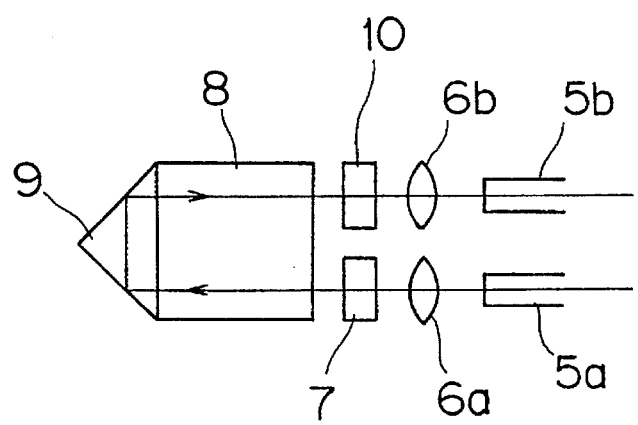
FIG. 2 shows the construction of a reflection type magnetooptic sensor head disclosed in Japanese Patent Preliminary Publication No. 56-55811.
Figure 3A:
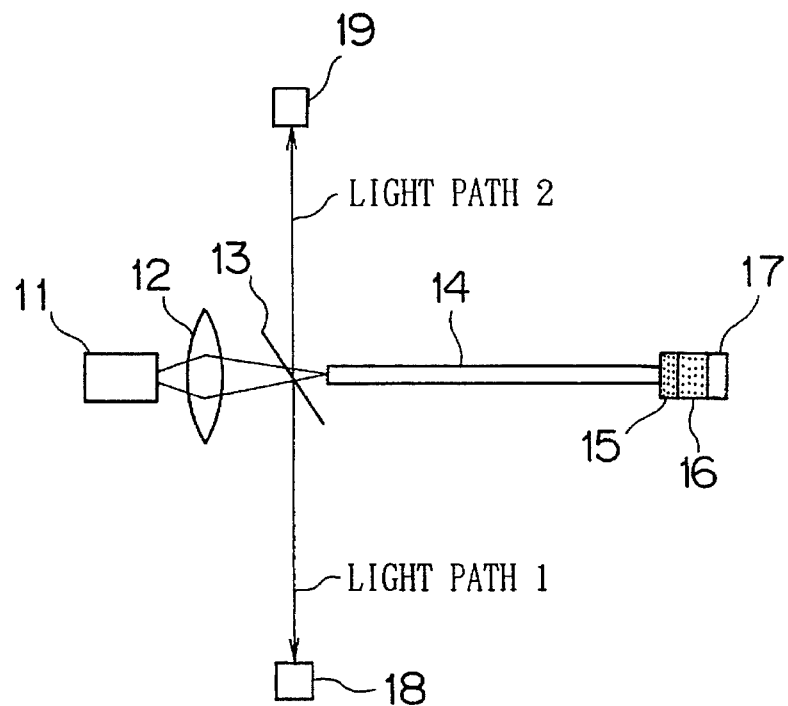
FIG. 3A shows the construction of a reflection type magnetooptic sensor head disclosed in Japanese Patent Publication No. 3-22595.
Figure 3B:
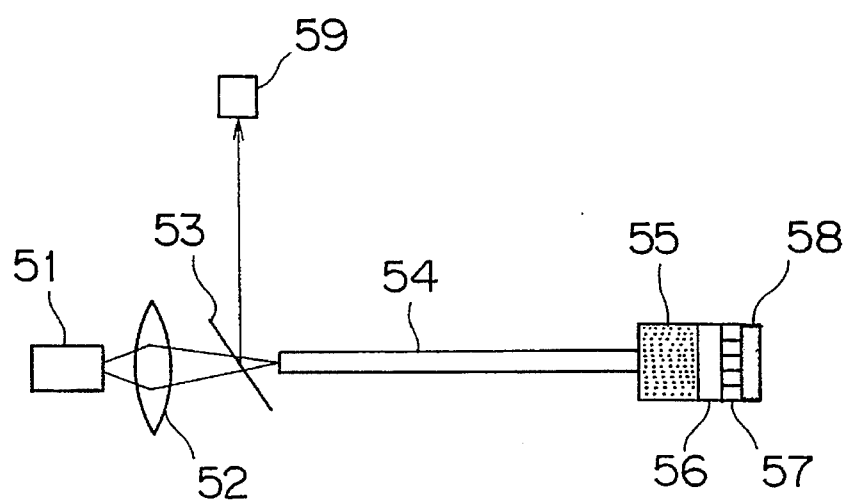
FIG. 3B shows the construction of a reflection type magnetooptic sensor head built by the inventors of the present invention based on the disclosure of Japanese Patent Publication No. 3-22595.
Figure 4A:
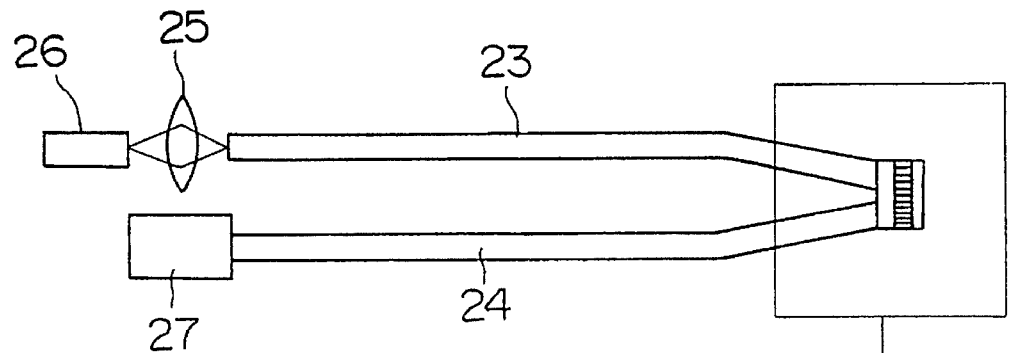
FIGS. 4A and 4B show the construction of a reflection type magnetooptic sensor head disclosed in Japanese Patent Application No. 4-90976.
Figure 4B:
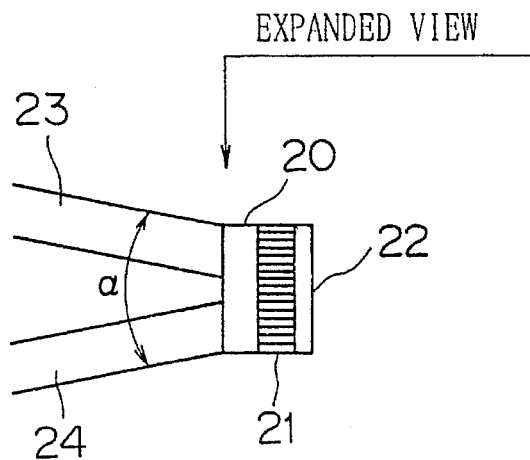
Figure 7:
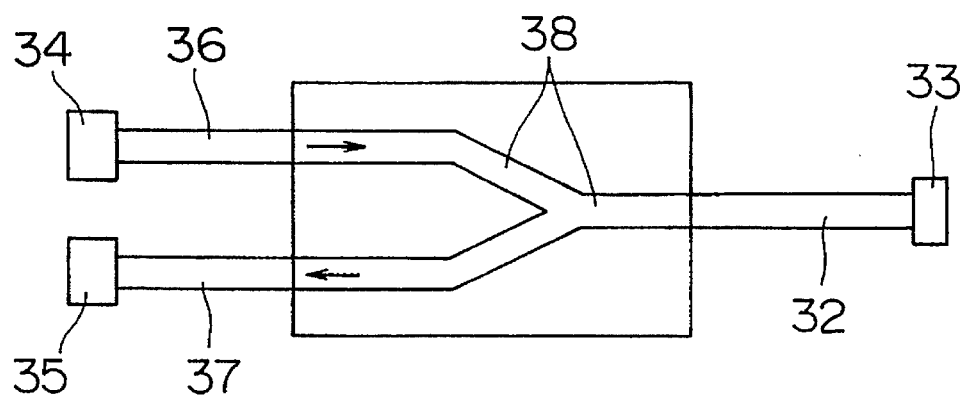
FIG. 7 shows an example of a general construction of a magnetooptic sensor head based on a magnetooptic sensor head according to the invention.

A half-silvered mirror technique as illustrated in FIG. 3B or a light branching circuit such as optical guides and optical couplers as shown in FIG. 7 are used for the connection between the light source, photodetector, and the reflection type magnetooptic sensor head based on a Faraday rotator made of a bismuth-substituted iron garnet. All or part of the optical fibers in FIG. 7 may be omitted, i.e., the reflection type magnetooptic sensor head may be connected directly to optical waveguides rather than via optical fibers.

The wavelength of the light source of the magnetooptic measuring apparatus is selected taking into account the sensitivity of the Faraday rotator, the light transmittance, the performance and cost of the light source, and the sensitivity of the detector. In the present invention, the wavelength of the light source is preferably in the near infrared the range from 780 to 850 nm for the following reasons:

(1) A bismuth-substituted iron garnet includes regions called "windows" where the optical absorption coefficient is relatively small.

(2) The Faraday rotation of a bismuth-substituted iron garnet is large.

(3) Bismuth-substituted iron garnet has a film thickness from 30 to 100 μm and is easy to manufacture.

(4) Short wavelength semiconductor lasers and light emitting diodes of high output are commercially available at low costs.

(5) The photodetector is highly sensitive and is available a low costs.

EXAMPLE 2-1

In FIG. 9, a magnetooptic measuring apparatus of the second embodiment includes a light inputting/outputting path 62, lens 63, polarizer 64, first rectangular prism 66, (111) bismuth-substituted iron garnet single crystal film (Faraday rotator 65), second rectangular prism 68, and reflecting film 67. These structural elements are disposed after a light source, not shown, in the aforementioned order. The bismuth-substituted iron garnet single crystal film is sandwiched between the beveled surfaces of the first rectangular prism and the second rectangular prism, and the polarizer is disposed in contact with a first surface of the first rectangular prism orthogonal to the optical axis of the light inputting/outputting path and the reflecting film is disposed in contact with a second surface of the second rectangular prism parallel to the first surface. The axes normal to the beveled surfaces of the rectangular prisms are at an angle from 10 to 70 degrees with the optical axis of the light inputting/outputting path. It should be noted that as shown in FIG. 9, the angle $\gamma$ (gamma) of the rectangular prism is substantially equal to the angle $\beta$ in the first embodiment if the (111) bismuth-substituted iron garnet single crystal film has a magnetization direction substantially the same as the axis normal to the surface of the film. A (111) bismuth-substituted iron garnet single crystal film manufactured by a known process has a magnetization direction substantially the same as the axis normal to the surface of the film. Thus, in practice, it can be assumed that the angle $\gamma$ is equal to the angle $\beta$.

In FIG. 9, a polarizer 64 is in the form of, for example, POLARCORE (trade name). A Faraday rotator 65 is made of a (111) bismuth-substituted iron garnet single crystal film, and is sandwiched between a first rectangular prism 66 and a second rectangular prism 68. The prisms 66 and 68 can be selected from those available on the market according to a specific design of the sensor head. A reflecting film 67 is made of, for example, metallic thin film. A lens 63 is in the form of, for example, gradient-index rod lens. A light inputting/outputting path 62 is in the form of optical fibers or optical guides. For miniaturization of a reflection type magnetooptic sensor head, the light inputting/outputting path 62 that serves as a light path may be arranged to serve to branch or separate the light reflected by the reflecting film 67 in order to direct the reflected light to the photodetector.

In the second embodiment, the difference $\Delta P$ in light intensity becomes greater than 2 dB when rectangular prisms are used such that the optical axis of the light incident upon the surface of the (111) bismuth-substituted iron garnet single crystal film makes an angle $\gamma$ in the range of 10 to 70 degrees with the axis normal to the surface of the (111) bismuth-substituted iron garnet single crystal film. The difference $\Delta P$ becomes greater with increasing angle $\gamma$. However, too large an angle causes the total reflection of the incident light ray by the surface of the (111) bismuth-substituted iron garnet, or makes it too difficult to manufacture the prisms. Therefore, the angle $\gamma$ should be in the range of 10 to 70 degrees, and more preferably in the orange of 20–45 degrees.

EXAMPLE 2-1

A bismuth-substituted iron garnet single crystal film was manufactured by the same process as the first embodiment. Then, using a known technique, the film was sliced into a predetermined size (2.5 mm by 2.5 mm) and was applied with a reflection film on each side of the film, thus manufacturing a Faraday rotator. Using a known process, aluminum was deposited on the reflecting surface of the second rectangular prism 68 (45-degree prism manufactured by Sigma Koki), i.e., the surface to which the incident light is normal. Then, the slanting surface is applied with an antireflection film. Likewise, the first rectangular prism 66 is applied with an antireflection film on the surface to which the light path is normal. The first and second prisms 66 and 68 are positioned relative to each other such that their slanting surfaces meet together as shown in FIG. 9. Between the two surfaces was held a Faraday rotator 65 in a sandwiched relation. The Faraday rotator 65 was bonded with an epoxy adhesive. Then, a polarizer 64 (POLARCORE, coined by CORNING) having an antireflection film applied thereon was mounted on the surface of the first rectangular prism to which the incident light is normal, thus completing a rectangular prism-Faraday rotator block. In a conventional manner, a gradient-index rod lens 63 (Trade name is SELHOCK coined by Nippon Itagarasu) was applied with an antireflection film on the surface to which the incident light is normal. Then, a polymer clad optical fiber having a 400 μm core diameter as a light inputting/outputting path 62 was assembled to the gradient-index rod lens 63, thus forming a lens block. The lens block and the rectangular prism-Faraday rotator block were assembled together into a magnetooptic sensor head as shown in FIG. 9. As shown in FIG. 11, this magnetooptic sensor head 63-68 was used in place of the magnetooptic sensor head 15-17 of the reflection type magnetooptic sensor head shown in FIG. 3A. Then, the magnetooptic sensor head 63-68 was placed in a magnetic field applying apparatus (trade name is MAGNET, manufactured by Magnetic). A light signal of a wavelength of 0.786 μm was output from a light source 69 (Model LTD024MD/PD SEMICONDUCTOR LASER manufactured by Sharp). The light is transmitted through the lens 60, half mirror 61, light inputting/outputting path (optical fiber) 62, lens 63, polarizer 64, first rectangular prism 66, Faraday rotator 65, and second rectangular prism 68 to the reflecting film 67 and is then reflected back by the reflecting film 67. The light reflected by the reflecting film 67 is then transmitted through the second rectangular prism 68, Faraday rotator 65, first rectangular prism 66, polarizer 64, lens 63, and inputting/outputting (optical fiber) 62 to the half mirror 61 which alters the direction of the returning light to direct the light to a photodetector 70 (Model AQ-1111, POWER METER, manufactured by Ando Electric Ltd.), which in turn measures the intensity to the light. The Faraday rotator 65 was magnetically saturated when applied with a magnetic field of 1000 Oe. The difference $\Delta P$ in light intensity between when the Faraday rotator 65 is not applied with a magnetic field of 1000 Oe and when applied, was 7.3 dB.

EXAMPLE 2-2

The construction was the same as Example 2-1 except that 20-degree rectangular prisms were used instead of 45-degree prisms. The difference $\Delta P$ in intensity was 4.6 dB.

EXAMPLE 2-3

The construction was the same as Example 2-1 except that ten-degree rectangular prisms were used instead of 45-degree prisms. The difference $\Delta P$ in intensity was 2.3 dB.

EXAMPLE 2-4

The magnetooptic sensor head used in Example 2-1 was assembled to the light inputting/outputting path (optical fiber) 32 of a light splitter, made of polymer optical guide, such as the one shown in FIG. 7. In Example 2-4, a light splitter was used which was manufactured by Mitsubishi Gasu Kagaku, Model 200S-D2 having an optical fiber core of 200 μm. A semiconductor laser light source (Manufactured by Kette System Service, Stabilized LD light source, Model KLD-780, wavelength is 0.783 μm) was assembled to the optical fiber 30, and the optical fiber 34 was assembled to the photodetector (The trade name is Model AQ-111, POWER METER, manufactured by Ando Electric.). The magnetooptic sensor head was installed in a magnetic field applying apparatus (The trade name is MAGNET, manufactured by Magnetic.).

For various conditions of magnetic field applied to the magnetooptic sensor head, the intensity of a signal light was measured with the photodetector 35 using a light ray having a wavelength of 0.783 μm output from the light source 29. The difference ΔP in intensity was 6.9 dB for a magnetic field of 1000 Oe between when the Faraday rotator is applied with a magnetic field and when not applied.

EXAMPLE 2-5

The construction was the same as Example 2-4 except that the optical sensor head of Example 2-2 was used instead of that used in Example 2-1. The difference ΔP in intensity was 4.6 dB.

EXAMPLE 2-6

The construction was the same as Example 2-4 except that the optical sensor head of Example 2-3 instead of the magnetooptic sensor head of Example 2-1. The difference ΔP in intensity was 2.3 dB.

EXAMPLE 2-7

The construction was the same as Example 2-4 except that the light emitting diode (wavelength is 0.85 μm, Model HK-5105 LED stabilized light source, manufactured by Shimazu Seisakusho) was used instead of a semiconductor laser light source of o.783 μm (Manufactured by Kette System Service). The difference ΔP in intensity was 5.8 dB.

EXAMPLE 2-8

A bismuth-substituted iron garnet single crystal film was manufactured in the following manner. A 500 milliliter platinum crucible was placed on an LPE furnace, which platinum crucible contained therein a lead oxide (PbO, 4N) of 843 grams, a bismuth oxide ($Bi_2O_3$, 4N) of 978 grams, a ferric oxide ($Fe_2O_3$, 4N) of 128 grams, a boron oxide ($B_2O_3$, 5N) of 38 grams, an europium oxide ($Eu_2O_3$, 3N) of 4.2 grams, and a holmium oxide ($Ho_2O_3$, 3N) of 9.0 grams. The content of the crucible was heated to a temperature of 1000 degrees so that the content melted. The melted content was then sufficiently beaten to produce a homogeneous mixture and was then cooled down to a melt temperature of 766 degrees to produce a melt for growing a bismuth-substituted iron garnet single crystal.

Then using a known process, a two-inch (111) substrate of a garnet single crystal $(GdCa)_3(GaMgZr)_5O_{12}$ having a thickness of 480 μm and lattice constant of 12.497±0.002 angstroms, was placed on the surface of the thus produced melt for 2.0 hours for epitaxial growth while maintaining the melt temperature at 766 degrees. A crystal obtained was a (111) bismuth-substituted iron garnet single crystal film having a compound of $Ho_{1.1}Eu_{0.6}Bi_{1.3}Fe_5O_{12}$ [(HoEuBiIG) single crystal] and having a film thickness of 40 μm. This crystal showed a Faraday rotation ΘF of 44.4 degrees at a wavelength 786 nm with magnetization saturated at 1200 Oe. Then, a Faraday rotator was manufactured as in Example 2-1 with which to build a magnetooptic sensor head.

The construction was the same as the Example 2-1 except that the aforementioned magnetooptic sensor head (Faraday rotator: $H_{1.1}Eu_{0.6}Bi_{1.3}Fe_5O_{12}$ single crystal) was used in place of the magnetooptic sensor head. The difference ΔP in intensity was 6.0 dB.

EXAMPLE 2-9

A bismuth-substituted iron garnet single crystal film was manufactured in the following manner. A 500 milliliter platinum crucible was placed on an LPE furnace, which platinum crucible contains therein a lead oxide (PbO, 4N) of 843 grams, a bismuth oxide ($Bi_2O_3$, 4N) of 978 grams, a ferric oxide ($Fe_2O_3$, 4N) of 120 grams, a gallium oxide ($Ca_2O_3$, 5N) of 4.5 grams, a boron oxide ($B_2O_3$, 5N) of 38 grams, and gadolinium oxide ($Gd_2O_3$, 3N) of 6.5 grams, and a yttrium oxide ($Y_2O_3$, 3N) of 4.0 grams. The content of the crucible was heated to a temperature of 1000 degree so that the content melted. The melted content was then sufficiently beaten to produce a homogeneous mixture and was then cooled down to a melt temperature of 773 degrees to produce a melt for growing a bismuth-substituted iron garnet single crystal.

Then, using a known process, a two-inch (111) substrate of a garnet single crystal $(GdCa)_3(GaMgZr)_5O_{12}$ having a thickness of 480 μm and a lattice constant of 12.497±0.002 angstroms, was placed on the surface of the thus produced melt for 2.5 hours for epitaxial growth while maintaining the melt temperature at 773 degrees. A crystal obtained was a (111) bismuth-substituted iron garnet single crystal film having a compound of $Gd_{0.9}Y_{0.9}Bi_{1.2}Fe_{4.8}Ga_{0.2}O_{12}$ and having a film thickness of 40 μm. This crystal showed a Faraday rotation $\Theta_F$ of 39.8 degrees at a wavelength 783 nm with magnetization saturated. The crystal was magnetically saturated at 600 Oe.

Then, a Faraday rotator was manufactured as in Example 2-1 to build a magnetooptic sensor head. The construction was the same as Example 2-4 except that the aforementioned magnetooptic sensor head (Faraday rotator: $Gd_{0.9}Y_{0.9}Bi_{1.2}Fe_{4.8}Ga_{0.2}O_{12}$ single crystal) was used in place of the magnetooptic sensor head used in Example 2-1. The difference ΔP in intensity was 3.2 dB.

Comparison 1

The construction was the same as Example 2-4 except that a 5-degree rectangular prism was used in place of a 45-degree rectangular prism used in Example 2-4. Measurement was made just as in Example 2-4 and the difference ΔP in intensity was 1.0 dB.

What is claimed is:

1. A reflection type magnetooptic sensor head comprising:

a light inputting/outputting path for directing a light;

a polarizer through which the light exiting said light path passes;

a Faraday rotator through which the light exiting said polarizer passes, said Faraday rotator being made of a (111) bismuth-substituted iron garnet single crystal film, said Faraday rotator being positioned such that an optical axis of the light incident upon a surface of said Faraday rotator makes an angle of 10 to 70 degrees with an axis normal to the surface of said Faraday rotator;

a reflecting film for reflecting the light exiting said Faraday rotator, said reflecting film being positioned such that an optical axis of the light exiting said Faraday rotator is normal to a reflection surface of said reflecting film.

2. The reflection type magnetooptic sensor head of claim 1, wherein said sensor head further comprises a first rectangular prism and a second rectangular prism, said first and second prisms being identical with each other, each of said prisms having a first surface, a second surface orthogonal to said first surface, and a slanting surface, said first and second rectangular prisms being positioned such that said Faraday rotator is sandwiched between said slanting surfaces and said first surfaces of said first and second rectangular prisms are parallel to each other and said second surfaces of said first and second rectangular prisms are parallel to each other.

3. The reflection type magnetooptic sensor head of claim 2, wherein each of said first and second rectangular prisms is such that an optical axis of the light exiting said polarizer makes an angle in the range of 10 to 70 degrees with an axis normal to said slanting surface of said first prism.

* * * * *